United States Patent
Lee et al.

(10) Patent No.: US 12,142,313 B2
(45) Date of Patent: Nov. 12, 2024

(54) SYSTEMS AND METHODS FOR CAPTURE AND REPLACEMENT OF HAMMERED WORD LINE ADDRESS

(71) Applicant: Lodestar Licensing Group, LLC, Evanston, IL (US)

(72) Inventors: Joo-Sang Lee, Frisco, TX (US); John E. Riley, McKinney, TX (US)

( * ) Notice: Subject to any disclaimer, the term of this patent is extended or adjusted under 35 U.S.C. 154(b) by 317 days.

(21) Appl. No.: 17/591,302

(22) Filed: Feb. 2, 2022

(65) Prior Publication Data

US 2022/0157366 A1 May 19, 2022

Related U.S. Application Data

(62) Division of application No. 16/887,065, filed on May 29, 2020, now Pat. No. 11,276,456.

(51) Int. Cl.
| | | |
|---|---|---|
| *G11C 11/408* | (2006.01) | |
| *G11C 11/406* | (2006.01) | |
| *G11C 11/4074* | (2006.01) | |
| *G11C 11/409* | (2006.01) | |

(52) U.S. Cl.
CPC .... *G11C 11/4085* (2013.01); *G11C 11/40615* (2013.01); *G11C 11/4074* (2013.01); *G11C 11/4087* (2013.01); *G11C 11/409* (2013.01)

(58) Field of Classification Search
CPC .......... G11C 11/4085; G11C 11/40615; G11C 11/4074; G11C 11/4087; G11C 11/409
USPC ...................................... 365/230.03
See application file for complete search history.

(56) References Cited

U.S. PATENT DOCUMENTS

| | | | |
|---|---|---|---|
| 9,478,316 B1 | 10/2016 | Ryu | |
| 10,403,390 B1* | 9/2019 | Wilson | G11C 17/16 |
| 10,468,076 B1* | 11/2019 | He | G11C 11/40615 |
| 11,152,078 B1* | 10/2021 | Du | G11C 29/12015 |
| 2019/0198090 A1 | 6/2019 | Lee | |
| 2020/0090729 A1* | 3/2020 | Son | G06F 3/0604 |
| 2020/0251158 A1 | 8/2020 | Shore et al. | |
| 2020/0321049 A1 | 10/2020 | Meier et al. | |

(Continued)

FOREIGN PATENT DOCUMENTS

| | | |
|---|---|---|
| CN | 108154895 A | 6/2018 |
| CN | 110473577 A | 11/2019 |
| CN | 110827884 A | 2/2020 |

OTHER PUBLICATIONS

Chinese office Action for CN Application No. 202110366813.2, Mailed Oct. 14, 2022, 10 Pages.

*Primary Examiner* — Connie C Yoha
(74) *Attorney, Agent, or Firm* — Fletcher Yoder, P.C.

(57) ABSTRACT

A memory device includes at least one memory bank comprising a set of redundant word lines, a set of normal word lines, and row hammer refresh logic. The RHR logic comprises a first input to receive a first signal indicative of whether a match was generated at a fuse of the memory device, a second input to receive a redundant row address corresponding to a first location of a memory array of the memory device, a third input to receive a word line address corresponding to a second location of the memory array of the memory device. The RHR logic also comprises an output to transmit at least one first memory address adjacent to the first location or at least one second memory address adjacent to the second location based on a value of the first signal.

18 Claims, 6 Drawing Sheets

(56) References Cited

U.S. PATENT DOCUMENTS

2021/0035624 A1* 2/2021 Okuno ................ G11C 11/4085
2023/0420024 A1* 12/2023 Riley ................ G11C 11/40615

* cited by examiner

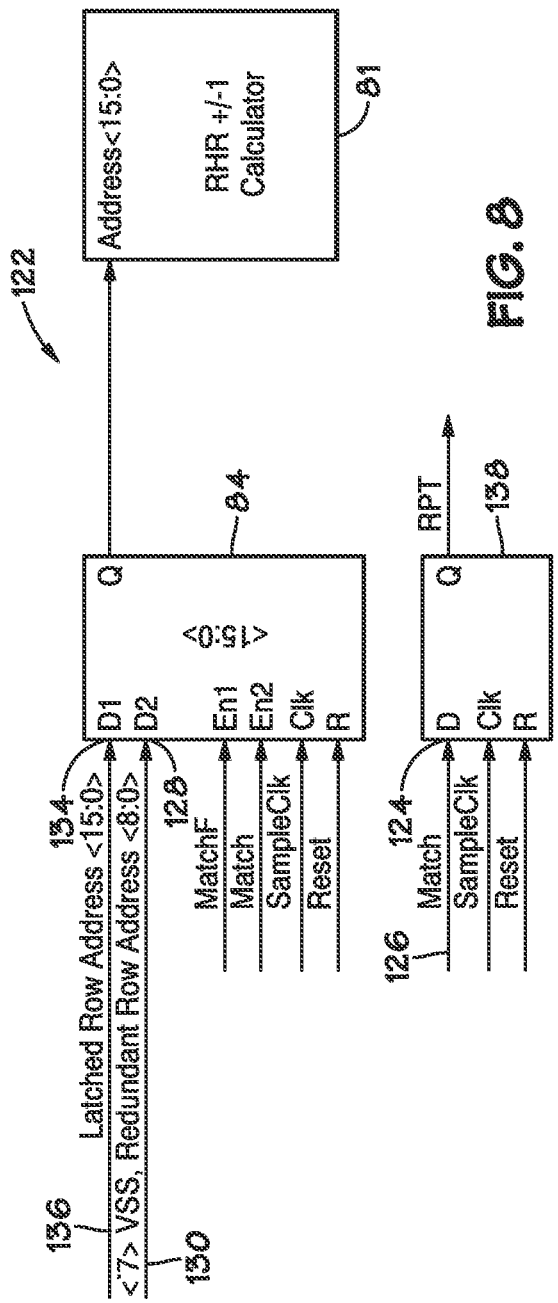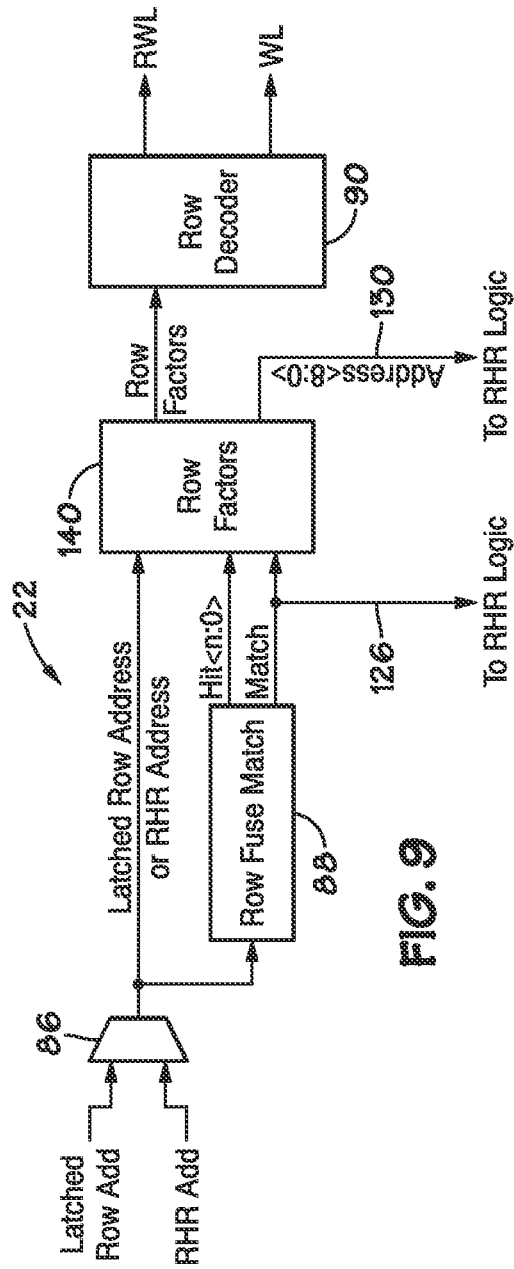

SYSTEMS AND METHODS FOR CAPTURE AND REPLACEMENT OF HAMMERED WORD LINE ADDRESS

CROSS-REFERENCE TO RELATED APPLICATIONS

The present application is a divisional of U.S. application Ser. No. 16/887,065, entitled "Systems and Methods for Capture and Replacement of Hammered Word Line Address," and filed May 29, 2020, now U.S. Pat. No. 11,276,546, which issued on Mar. 15, 2022, the entirety of which is incorporated by reference herein for all purposes.

BACKGROUND

Field of the Present Disclosure

Embodiments of the present disclosure relate generally to the field of semiconductor devices. More specifically, embodiments of the present disclosure relate to performing row hammer refresh operations in redundant memory.

Description of Related Art

A semiconductor memory device, such as a dynamic random-access memory (DRAM), may store data as bits in memory cells that are implemented using capacitors and transistors. For example, the charge state (e.g., charged or discharged) of a capacitor may determine whether a memory cell stores "1" or "0" as a binary value. Large numbers of memory cells may be packed into the semiconductor memory device, along with additional logic that, for example, enables reading data to, writing data from, and refreshing data in, the memory cells.

The memory cells may be organized as rows and columns, and each memory cell may be accessed via a memory address that includes a row address and a column address, which are processed by row and column address decoders. After a row or word line is selected or activated via the row address for a read operation, bits from all memory cells in the row are transferred into sense amplifiers that form a row buffer, from which a bit is selected via the column address. Because a read operation transfers memory cell charges into the row buffer, the memory cells may be rewritten to retain their values (e.g., prior to the read operation). Write operations decode the addresses in a similar manner, with entire rows being rewritten to change a single bit of a memory cell.

However, memory cells may lose their state (e.g., stored data bits) over time due to using capacitors that have a natural discharge rate. To prevent this loss of state, the memory cells may be periodically rewritten, a process known as refreshing. Moreover, memory cells may be susceptible to random changes in stored data, which are known as soft memory errors, and may be attributed to cosmic rays and other causes. There are different techniques that counteract soft memory errors and improve the reliability of DRAM, of which error-correcting code (ECC) memory and its advanced variants (such as lockstep memory) are most commonly used.

Increased densities of semiconductor memory device have led to physically smaller memory cells capable of storing smaller charges, resulting in lower operational noise margins, increased rates of electromagnetic interactions between the memory cells, and greater possibility of data loss. As a result, disturbance errors have been observed, being caused by cells interfering with each other's operation and manifesting as random changes in the values of bits stored in affected memory cells. In particular, frequent row or word line activations (e.g., in an "aggressor" word line) in a high density of memory cells may cause voltage fluctuations on associated word line selection lines, which may induce higher-than-natural discharge rates in capacitors belonging to nearby or adjacent word lines (e.g., "victim" word lines). If the affected memory cells are not refreshed before they lose too much charge, these disturbance errors may occur. This effect is referred to as the "row hammer effect."

Complicating the performance of refreshing a victim word line is locating the victim word line when it has been relocated to a redundant word line. Semiconductor memory devices may include redundant rows or word lines used to relocate data bits in a "normal" or non-redundant memory word line when the normal word line becomes faulty (e.g., unable to properly store data bits). In some memory devices, the redundant word lines may be addressed in a different manner than normal word lines. As such, refreshing the redundant word lines that store relocated data from normal word lines that are addressed differently than the redundant word lines may employ a different process than refreshing the normal memory word lines.

Typically, an aggressor word line address may be incremented and decremented to determine the neighboring victim word line addresses, and translation logic (fuse logic in a memory device) may be used to translate the neighboring victim word line addresses to any associated redundant memory word line addresses. However, the translation logic may take up an undesirable amount of space in the memory device and increase the overall size of the memory device. Moreover, there may be cases where the aggressor word line has been relocated to a redundant memory word line, but the neighboring normal word lines to the aggressor word line have not. As such, typically row hammer refresh operations may refresh the neighboring normal word lines, but not the neighboring redundant word lines, thus not effectively addressing the row hammer effect.

Embodiments of the present disclosure may be directed to one or more of the problems set forth above.

BRIEF DESCRIPTION OF DRAWINGS

FIG. 8 is a block diagram of the row hammer refresh logic of FIG. 7, according to an embodiment of the present disclosure; and FIG. 9 is a block diagram of an embodiment of a portion of the bank control block of FIG. 7, according to an embodiment of the present disclosure.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As described in detail below, a reduction in Row Access Strobe (RAS) to Column Access Strobe (CAS) delay (tRCD), i.e., the time between accessing a row of data, and then accessing the related column of data, is beneficial to the operation of a memory device. One technique to reduce the tRCD is to group redundant word lines (or rows) used to relocate data bits in a "normal" or non-redundant memory word line when the normal word line becomes faulty (e.g., unable to properly store data bits) into a single section of a predetermined memory bank. By grouping the redundant word lines (RWLs) into a single section of a predetermined memory bank (instead of distributing the RWLs in every section of a predetermined bank of memory or in a particular plurality of predetermined sections in a particular memory bank), redundancy evaluation operations may be performed in parallel with memory access operations, thus reducing the tRCD impact of threshold voltage (Vt) compensation associated with the memory access.

However, locating the RWLs in a single section of a predetermined memory bank also typically increases the footprint (e.g., the size) of the traditional steering logic utilized in finding neighboring RWLs, which is generally undesirable as the densities of memory devices increase. Accordingly, in place of traditional steering logic, a row hammer logic counter may be shared and utilized in both normal word line operations and RWL operations so that the overall layout of the memory device is not increased when RWLs are located in a single section of a predetermined memory bank of a memory device.

Figure 1:
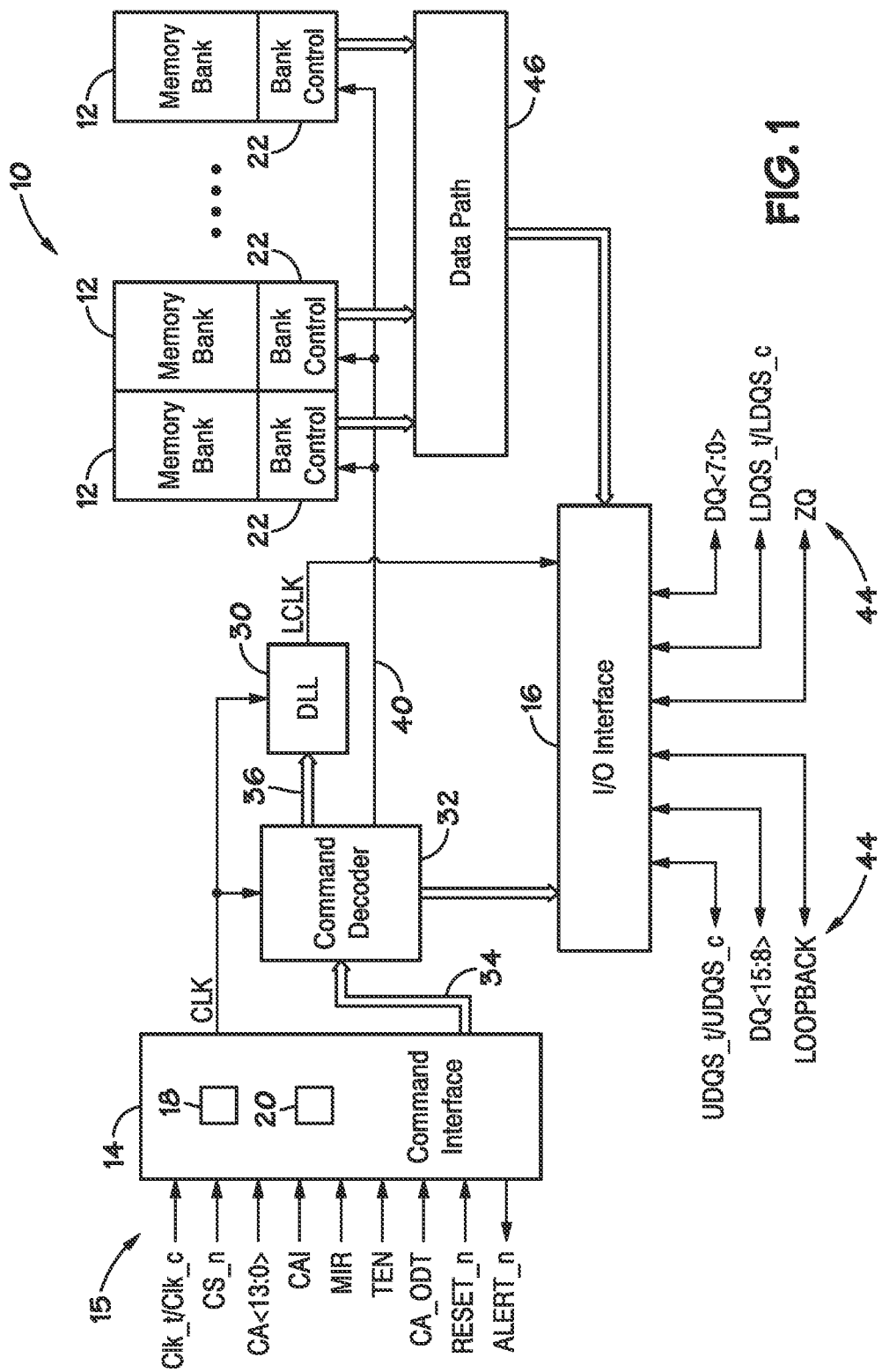
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×4, ×8, or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t/) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the TO interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a ×16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_c), the data strobe (DQS) signals may be provided as a differential pair of data strobe signals (DQS_t/ and DQS_c) to provide differential pair signaling during reads and writes. For certain memory devices, such as a DDR5 SDRAM memory device, the differential pairs of DQS signals may be divided into upper and lower data strobe signals (e.g., UDQS_t/ and UDQS_c; LDQS_t/ and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
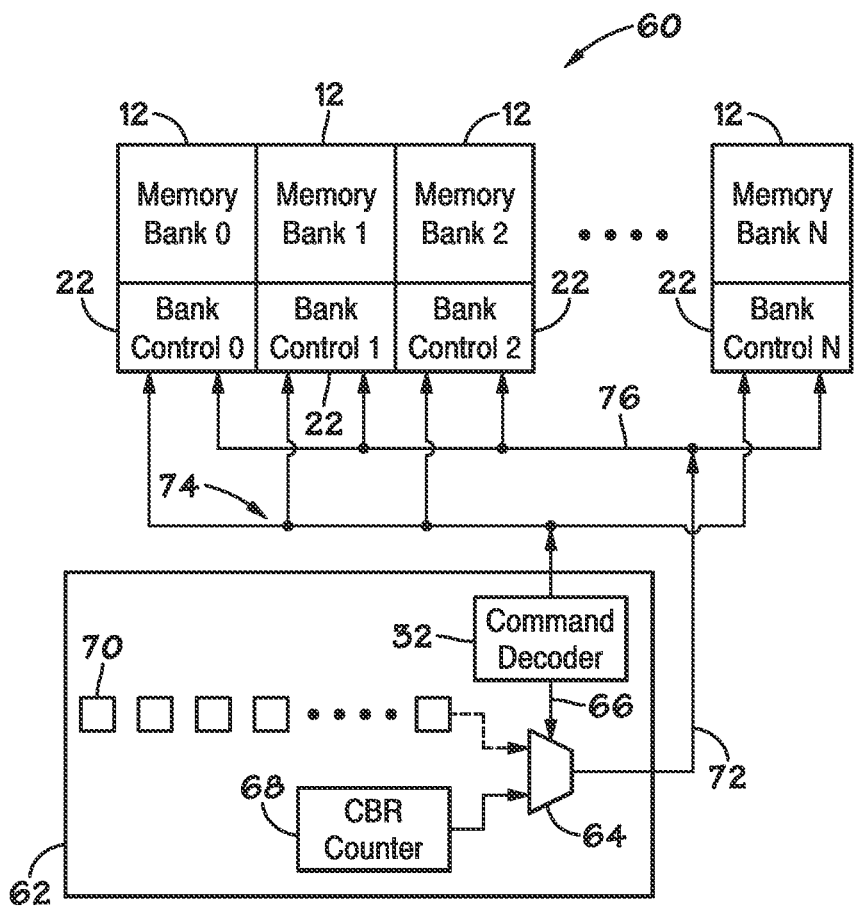
FIG. 2 is a block diagram of a memory system for accessing word lines of the memory device of FIG. 1, according to an embodiment of the present disclosure.

With the foregoing in mind, FIG. 2 is a schematic diagram of a memory system 60 for accessing (e.g., refreshing or activating) word lines of the memory device 10 of FIG. 1, according to an embodiment of the present disclosure. The memory system 60 may include pre-memory bank circuitry 62 that provides a word line address to the one or more bank control blocks 22 (e.g., via the command decoder 32). The pre-memory bank circuitry 62 may include a multiplexer 64 that receives a selection signal 66 from the command decoder 32 and then selects either a word line address stored in a counter 68 (e.g., a Column Access Strobe (CAS) Before Row Access Strobe (RAS) counter or a "CBR" counter) that may keep track of a word line to be refreshed or a word line address by an external input (e.g., via pads 70) based on the selection signal 66.

The selection signal 66 may be based on whether a command sent to the command decoder 32 is a refresh command (to refresh one or more word lines of one or more memory banks 12) or activate command (to activate a word line of a memory bank 12). For example, when the command is a refresh command, the multiplexer 64 may select the word line address stored in the CBR counter 68. When the command is an activate command, the multiplexer 64 may select the word line address provided by the external input.

Transmission of the word line address 72 selected by the multiplexer 64 may be controlled by the command decoder 32. Additionally, the command decoder 32 may decode the command (e.g., a refresh command or an activate command), and send the decoded command to the one or more bank control blocks 22 via command path 74 and the command decoder 32 transmits and/or controls transmission of the word line address 72 to the one or more bank control blocks 22 via the row address path 76. The corresponding one or more bank control blocks 22 may then refresh at least the word line address stored in the CBR counter 68 or activate at least the word line address (e.g., to perform a read or write operation) provided by the external input, depending on which was transmitted as the word line address 72.

The activate (ACT) command selects a bank and row address and transfers the cell data of that row, which is stored in the array, to the sense amplifiers. The data stays in the sense amplifiers until a PRECHARGE command to the same bank restores the data to the cells in the array. When data is stored in the sense amplifier, the DRAM is said to be in the active state. After the data in the sense amplifiers has been restored to the memory array, it is said to be in the precharge state. When the DDR SDRAM is in the active state, READs and WRITEs may take place. A READ command decodes a specific column along the row that is stored in the sense amplifiers. The data from this column is driven through the I/O gating to the internal read latch. Once in the latch, it is multiplexed onto the output drivers. It is also possible to write data to the sense amplifiers while the bank is active. The process is the opposite of the read process. Data from the DQ pins is latched into the data receivers/registers and transferred to the internal data drivers. The drivers then transfer the data to the sense amplifiers through the I/O gating to the decoded column address.

Figure 3:
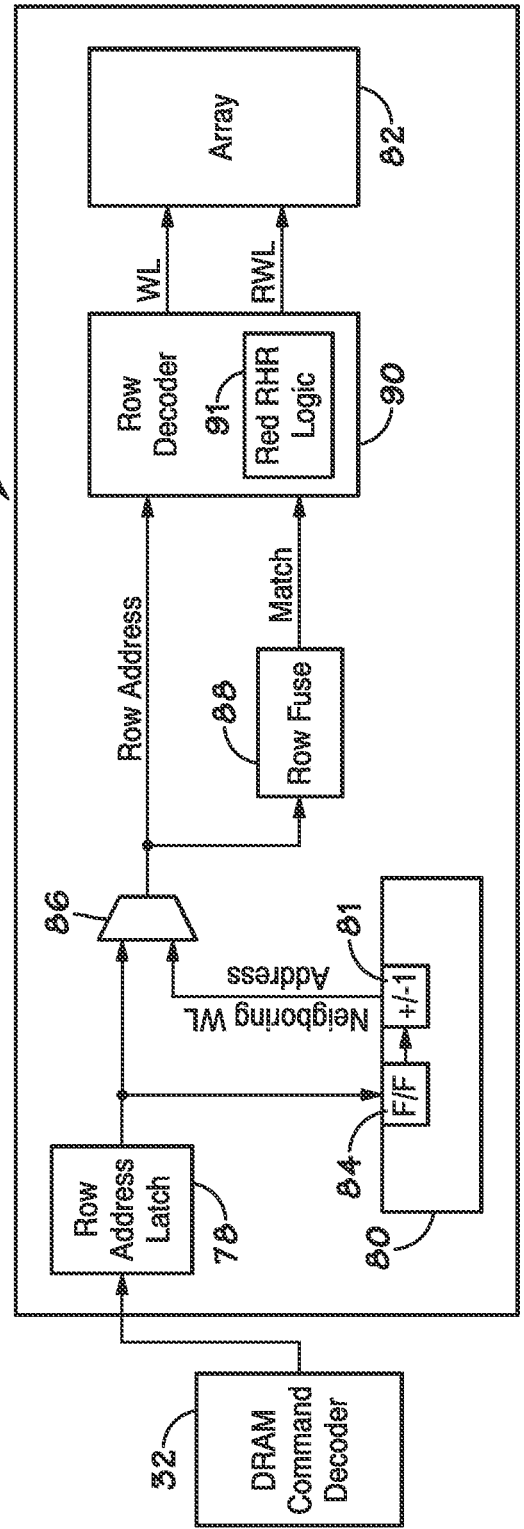
FIG. 3 is a block diagram of a bank control block of the memory device of FIG. 1 that performs row hammer refresh operations and locates redundant word lines, according to an embodiment of the present disclosure.

During normal operation of the memory device 10, rows or word lines of a memory device 10 may become faulty (e.g., unable to properly store data bits). The data in the faulty word lines may be relocated to redundant rows or word lines of the memory device 10 so that the data may be retained. However, to retrieve the relocated data, the data must first be located. FIG. 3 is a block diagram of a bank control block 22 of the memory device 10 of FIG. 1 that performs row hammer refresh operations and locates relocated word lines, according to an embodiment of the present disclosure. The bank control block 22 may include a row address latch 78 or any other suitable storage device that stores the word line address 72 (e.g., selected by the multiplexer 64 of FIG. 2).

The bank control block 22 may also include row hammer refresh logic 80 that performs refresh operations of one or more word lines of an array 82 of one of the memory banks 12 to prevent data loss due to the row hammer effect. As illustrated, the row hammer refresh logic 80 includes a flip-flop 84 or any other suitable storage device or storage element or circuit that stores the word line address stored in the row address latch 78 as a "seed word line address."

The row hammer refresh logic 80 may periodically or randomly, depending on the programmed scheme, store the word line address stored in the row address latch 78 in the flip-flop 84. In some embodiments, for example, for every target period of time, the row hammer refresh logic 80 may store the word line address stored in the row address latch 78 in the flip-flop 84. Additionally, the row hammer refresh logic 80 may further include a row hammer refresh (RHR) calculator 81. This RHR calculator 81 may be a +1/−1 counter that may increment and/or decrement a received address that is selected in the row hammer refresh logic 80 if the seed word line address is an address of a "normal" or non-redundant word line. If the seed word line address is instead an address of a redundant word line, bit-flipping logic of the row hammer refresh logic 80 may be used, and the redundant RHR logic 91 may be used instead of the RHR calculator 81.

Because the row hammer effect may refer to the loss or scrambling of data in neighboring (e.g., adjacent) word lines (or victim word lines) when a target word line (or aggressor word line) is activated (e.g., frequently), the bank control block 22 may refresh neighboring (e.g., adjacent) word lines of the seed word line address (e.g., seed word line address±1) to counteract the row hammer effect. As such, the row hammer refresh logic 80 and steering logic may include incrementing/decrementing logic that receives a seed word line address stored in the flip-flop 84 to determine the neighboring word line addresses of the seed word line address. In particular, to determine a first neighboring word line address, the incrementing/decrementing logic may simply flip the least significant bit of the seed word line address (from 0 to 1, or vice versa). The resulting word line address may be associated with a word line referred to as the "simple" neighboring word line of the seed word line (having the word line address of the seed word line address). However, the incrementing/decrementing logic may use more complex logic and/or time to determine the second (e.g., remaining) neighboring word line address (the "complex" neighboring word line). For example, when sending signals indicative of the neighboring word line addresses to be refreshed, the incrementing/decrementing logic may send the simple neighboring word line address first (due to the shorter amount of time used to determine the simple neighboring word line address), and then send any complex neighboring word line address.

In conjunction with the receipt of an ACT command, the command decoder 32 transmits a row address to a particular bank memory bank 12 (e.g., memory bank 0) to activate a word line of the selected memory bank 12. This row address is saved in the row address latch 78, which subsequently transmits the row address to both the row fuse logic 88 and the (row) decoder logic 90 via a multiplexer 86. The decoder logic 90 may, for example, operate to extract or decode word line addresses from an input signal. Additionally, the row fuse logic 88 may map a word line address corresponding to a faulty word line of the memory bank 12 to a word line address of a redundant word line of the memory bank 12. That is, in the case that the transmitted address corresponds to a faulty word line that has been mapped to a redundant word line, the row fuse logic 88 may send a redundant word line (relocated word line) address to the decoder logic 90. If this redundant word line address is received at the decoder logic 90 (i.e., if there was a match at the row fuse logic 88), then the decoder logic 90 selects and transmits to the redundant word line location instead of a normal word line location in the array 82. However, if no redundant word line address is received at the decoder logic 90 (i.e., if there was no match at the row fuse logic 88), the decoder logic 90 selects and transmits to normal word line location in the array 82.

If a refresh (REF) command (to refresh one or more word lines of one or more memory banks 12) is received at the command decoder 32, a transmitted CBR counter (refresh counter) address is transmitted to the bank control block 22 and is saved in the row address latch 78. Subsequently, this address is transmitted to both the row fuse logic 88 and the (row) decoder logic 90 via a multiplexer 86 (although the row fuse logic is disabled). Thereafter, the decoder logic 90 may, for example, operate to select a group of word lines or redundant word lines, whereby selection of the redundant word lines may include transmission of a redundant pre tab (RPT) signal (i.e., an extra bit) to assist in the selection of a group of redundant word lines. For example, based on the value of the RPT signal (e.g. the extra bit), the decoder logic may select either a group of word lines or a group of redundant word lines (i.e., RPT value is read and its value, 0 or 1, is used to determine whether normal word lines or redundant word lines are selected).

In conjunction with the ACT command when no match is found in the row fuse logic 88 (i.e., if no redundant word line address is received at the decoder logic 90 and the decoder logic 90 selects and transmits to normal word line location in the array 82), the row hammer refresh logic 80 may operate to find neighboring word lines for the normal word line location transmitted from the decoder logic 90. For example, as generally outlined above, the row hammer refresh logic 80 include, for example, the RHR calculator 81, which may be a +1/−1 counter that may increment and/or decrement a received address that is selected in the row hammer refresh logic 80 if the seed word line address is an address of a "normal" or non-redundant word line. However, if the stored (e.g., hammered) address is a redundant word line, the neighboring word lines can be determined in the redundant RHR logic 91. However, the logic to determine the location of the neighboring word lines when the stored (e.g., hammered) address is a redundant word line may be present in the row hammer refresh logic 80 and the simple neighboring word line addresses (from the RHR calculator 81) or the redundant neighboring word line addresses (whichever is generated via the row hammer refresh logic 80) may be transmitted to the multiplexer 86. The multiplexer 86 may then output one of the word line addresses (whichever was received) as an output to allow for a refresh operation of the word line addresses received from the multiplexer 86.

Figure 4:
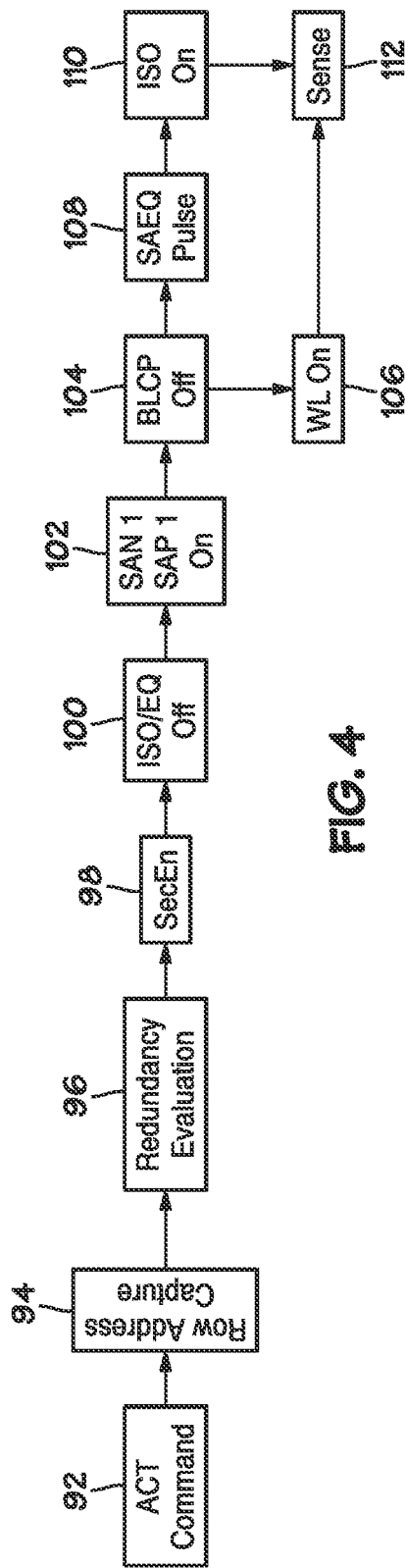
FIG. 4 is a flow diagram of a first technique for voltage threshold compensation of sense amplifiers of the memory array of FIG. 3, according to an embodiment of the present disclosure.

In some embodiments, sense amplifiers of the memory array 82 have a threshold voltage (Vt) compensation scheme applied thereto. For example, a plurality of sense amplifiers of the array 82 may include threshold voltage compensation circuitry that compensates for threshold voltage differences between components of the sense amplifiers. One technique for Vt compensation is illustrated in FIG. 4. In line with the previous discussion, an ACT command is received (step 92) at the command decoder 32, causing the command decoder 32 to transmit a row address to a particular bank memory bank 12 (e.g., memory bank 0) to activate a word line of the selected memory bank 12. This row address is saved (captured as a row address capture) in the row address latch 78 (step 94). The redundancy evaluation (step 96) is undertaken, whereby in the case that the transmitted address corresponds to a faulty word line that has been mapped to a redundant word line, the row fuse logic 88 may send a redundant word line (relocated word line) address to the decoder logic 90. If this redundant word line address is received at the decoder logic 90 (i.e., if there was a match at the row fuse logic 88), then the decoder logic 90 selects and transmits to the redundant word line location instead of a normal word line location in the array 82.

The section that is to be enabled (step 98) is determined thereafter. That is, the section of the array 82 in which the redundant word line location is present is determined. Once determined, in step 100, isolation signals and equilibrating signals for transistors of the sense array that correspond to the determined section are set to off while, in step 102, sense-amplifier N and P control signals are set to on. In step 104, a bit line pre-charge control line (BLCP) is set to off. Subsequently, the word line is activated in step 106 and as a sense amplifier equalization pulse is generated in step 108. Thereafter, the isolation signals are set to on in step 110 and the sense operation occurs in step 112.

The technique outlined in FIG. 4 may include a tRDC penalty resultant from grouping redundant word lines in multiple sections of the array 82. That is, to provide Vt compensation as illustrated in FIG. 4, the correct section to be activated must be determined. Thereafter, the respective sense amplifier(s) must be activated for the determined section. Thus, as step 96 occurs prior to sense amplifier activation and Vt compensation (i.e., in series), a tRDC penalty may occur.

Figure 5:
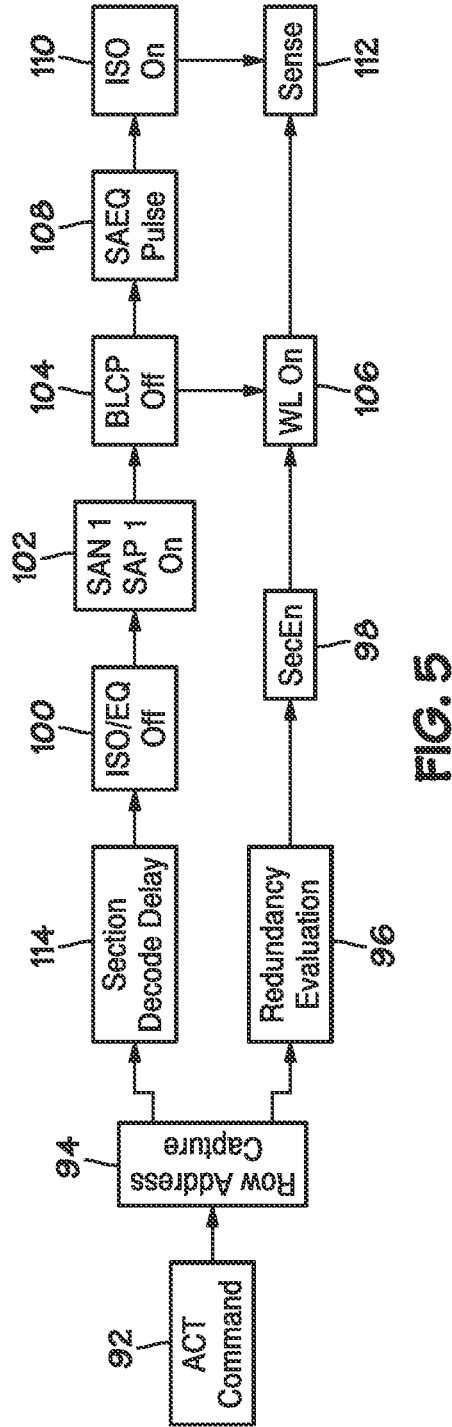
FIG. 5 is a flow diagram of a second technique for voltage threshold compensation of sense amplifiers of the memory array of FIG. 3, according to an embodiment of the present disclosure.

In contrast, a second technique for Vt compensation is illustrated in FIG. 5 in which all of the redundant word lines for the memory array 82 are grouped in a single section of the memory array 82. Steps 92 and 94 are undertaken similar to described above with respect to FIG. 4. Thereafter, while the redundancy evaluation (step 96) is undertaken, step 114 is performed in parallel. In step 114, the normal address decode process is undertaken whereby no redundant word line address is received at the decoder logic 90 (i.e., if there was no match at the row fuse logic 88), then the decoder logic 90 determines the normal word line location in the array 82. Because step 114 identifies an address range that the normal word line resides in, the corresponding sense amplifiers to be activated can be identified. In addition to turning on the normal section, the redundant section may also be activated (because the determination of whether a match occurs in step 96 has not occurred). If a match occurs, the redundant section of the array 82 has had a Vt compensation value calculated and/or applied and the normal section has had Vt compensation value calculated and/or applied in conjunction with the process of FIG. 5. By performing steps 114 and 96 in parallel, any tRDC penalty may be reduced and/or eliminated.

Figure 6:
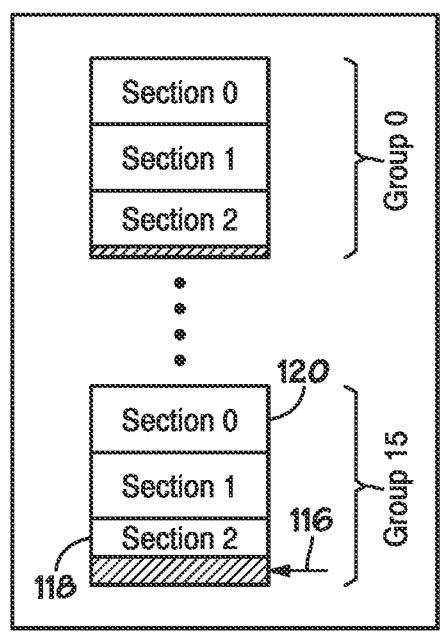
FIG. 6 is a block diagram of the memory array of FIG. 3 in which all of the redundant rows are located in a single section of the memory array, according to an embodiment of the present disclosure.

FIG. 6 illustrates an example of a memory array 82 in which all of the redundant rows 116 are located in a single section 118 of memory array 82 (i.e., in a redundant portion). This locating of the redundant rows 116 may be used, as discussed above, in conjunction with the technique of FIG. 5 to allow at least for concurrent Vt compensation calculation. As illustrated, while section 120 may have approximately 4000 rows for storage, section 118 may have less rows dedicated to storage (e.g., approximately 3538 rows) with the remaining rows (e.g., approximately 512 rows) dedicated to redundant rows 116. However, other values for the size of sections 118 and 120 as well as redundant rows 116 are envisioned.

Figure 7:
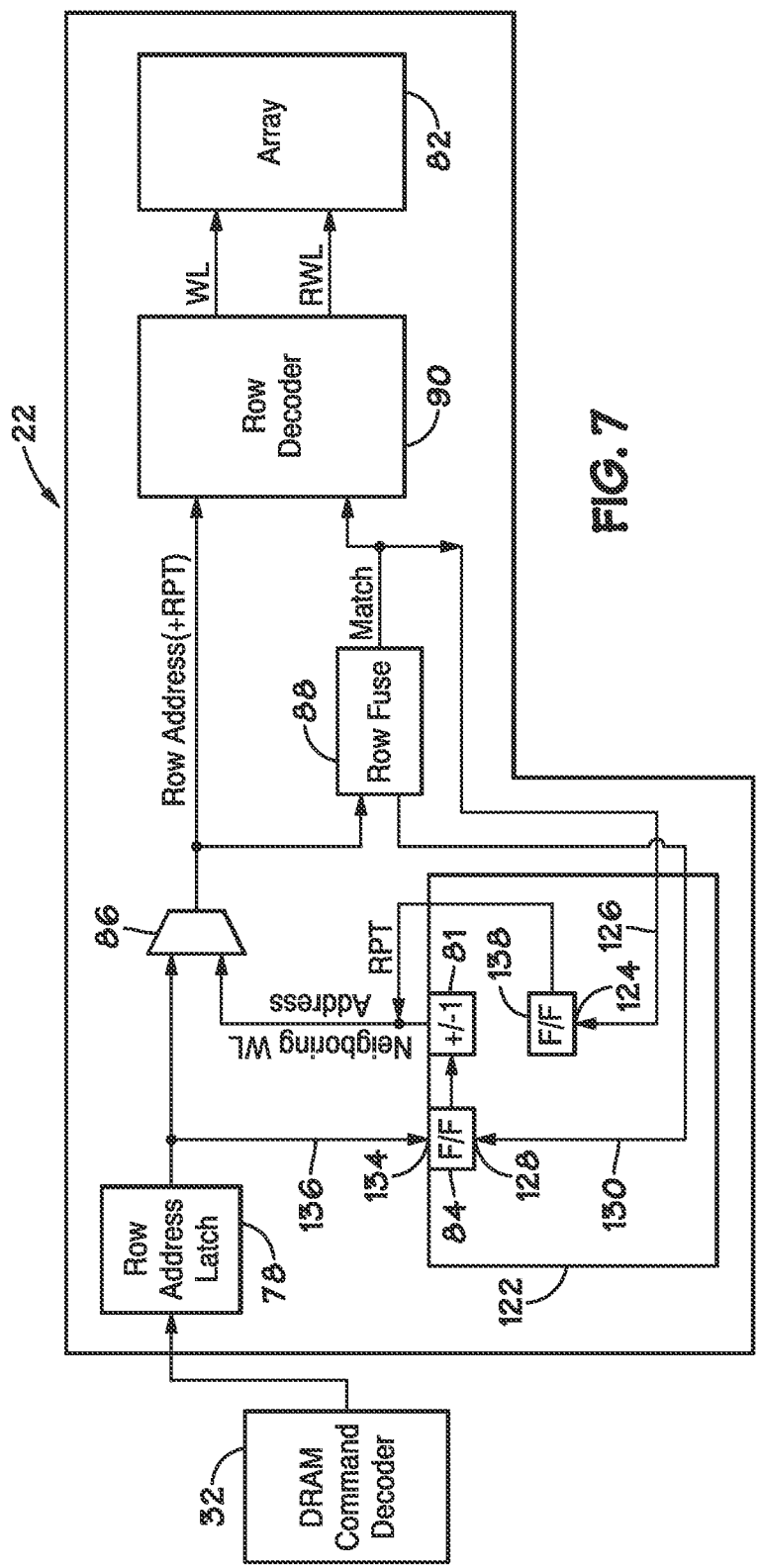
FIG. 7 is a block diagram of a second embodiment of a bank control block of the memory device of FIG. 1 that performs row hammer refresh operations and locates redundant word lines, according to an embodiment of the present disclosure.

Utilization of the technique of FIG. 5 may also affect the encoding of the redundant elements. FIG. 7 illustrates a second embodiment of a bank control block 22 of the memory device of FIG. 1 that includes the row address latch 78, the memory array 82, the flip-flop 84 or any other suitable storage device, the multiplexer 86, the row fuse logic 88, and the decoder logic 90. Additionally, the bank control block 22 includes row hammer refresh logic 122 that performs refresh operations of one or more word lines of an array 82 of one of the memory banks 12 to prevent data loss due to the row hammer effect.

Row hammer refresh logic 122 includes a first input 124 that is coupled to the row fuse logic 88 to receive a match signal from the row fuse logic. That is, in the case that the transmitted address corresponds to a faulty word line that has been mapped to a redundant word line, the row fuse logic 88 may send a redundant word line (relocated word line) address to the decoder logic 90. If this redundant word line address is received at the decoder logic 90 (i.e., if there was a match at the row fuse logic 88), then the decoder logic 90 selects and transmits to the redundant word line location instead of a normal word line location in the array 82. However, if no redundant word line address is received at the decoder logic 90 (i.e., if there was no match at the row fuse logic 88), then the decoder logic 90 selects and transmits to normal word line location in the array 82. The match signal (for example, a zero if there was no match at the row fuse logic 88 and a one if there was a match at the row fuse logic 88) is transmitted along path 126 to the row hammer refresh logic 122. Likewise, row hammer refresh logic 122 includes a second input 128 that is additionally coupled to the row fuse logic 88 or other circuitry. Input 128 receives a pretest row address (i.e., a redundant row address) along path 130.

The row hammer refresh logic 122 further includes the RHR calculator 81, which may be a +1/−1 counter that may increment and/or decrement a received address that is selected in the row hammer refresh logic 122. Additionally, the row hammer refresh logic 122 includes an additional input 134 coupled to path 136 that receives the word line address stored in the row address latch 78. Additionally, the row hammer refresh logic 122 may include a selection circuit 138 that transmits the match signal as an indication to the RHR calculator 81 of whether to utilize a first predetermined number of address bits corresponding to the received address (if the match signal=0 and the latched row address is sent) or a second predetermined number of address bits less than the first number of address bits (if the match signal=1 and the redundant row address is sent).

Additionally, the row hammer refresh logic 122 may include a selection circuit 138 (e.g., a flip-flop). The selection circuit 138 operates to transmit the RPT signal from the row hammer refresh logic 122, which is joined with the Neighboring WL Address signal transmitted from the RHR calculator 81 and transmitted to the multiplexer 86. As previously noted, the RPT signal can have a value of one bit (i.e., an extra bit) to assist in the selection of a group of redundant word lines. For example, based on the value of the extra bit, either a group of word lines or a group of redundant word lines is selected (i.e., the RPT signal is read and its value, 0 or 1, is used to determine whether normal word lines or redundant word lines are selected).

It should also be noted that FIG. 7 omits the use of the redundant RHR logic 91. This removal of redundant RHR logic 91 reduces the footprint of the row decoder circuitry and reduces the complexity thereof, since the hardcoded redundant RHR logic 91 (which was altered based on respective implementations) is no longer present. Thus, in conjunction with FIG. 7, instead of the redundant elements spread across the array 82 (in conjunction with FIG. 3), the redundant elements are in a single section, i.e., the redundant rows 116 are located in a single section 118 of memory array 82 (i.e., in a redundant portion). Thus, as the redundant elements are not scattered about the array 82, a large redundant RHR logic 91 is no longer included and instead, the row hammer refresh logic 122, including the selection circuit 138, can operate to select the respective redundant elements. This reduces the amount of logic and complexity otherwise used (via the redundant RHR logic 91) to locate respective redundant elements, since the redundant elements are in a single section (e.g., in a single section 118 of memory array 82) and a grouped together therein (e.g., in a redundant portion). Thus, no steering logic (such as redundant RHR logic 91) is present in FIG. 7 (i.e., in the row decoder), in contrast with the embodiment previously described with respect to FIG. 3. FIG. 8 more clearly illustrates an embodiment of the row hammer refresh logic 122.

As illustrated in FIG. 8, the row hammer refresh logic 122 includes the flip-flop 84, which receives a word line address from input 134, a redundant row address from input 128, and the match signal from input 124. As illustrated, after a row is activated (e.g., a hammered row), the flip-flop 84 utilizes the match signal to determine which address is sent to the RHR calculator 81. For example, if the match signal=1, then the redundant row address is sent. Likewise, if the match signal=0, then the latched row address is sent. Additionally, the row hammer refresh logic 122 may include a selection circuit 138 (e.g., a flip-flop) that transmits the RPT signal as an indication to the multiplexer 86 to assist in the selection of a group of redundant word lines. For example, based on the value of the extra bit, either a group of word lines or a group of redundant word lines is selected (i.e., RPT signal is read and its value, 0 or 1, is used to determine whether normal word lines or redundant word lines are selected). The RPT signal can be generated based upon the received match signal (if the match signal=0, the RPT value is 0 and if the match signal is 1, the RPT value is 1).

In some embodiments, less address bits are transmitted in conjunction with the redundant row address relative to the latched row address because the omitted bits of the redundant row address relative to the latched row address indicate the section in which the redundant word line can be found. And since only one section is utilized to store the redundant word lines, the address bits corresponding to that section may be omitted from the redundant row address when it generated and subsequently transmitted along path 130.

The signal generated in the RHR calculator 81 is transmitted via an output of the row hammer refresh logic to the multiplexer 86. This signal corresponds to the neighboring address locations to the hammered address (e.g., the victim addresses) and corresponds to either redundant or normal word lines, based upon the operations of the flip-flop 84, and the selection circuit 138 outputs the RPT signal to be combined with the signal transmitted from the RHR calculator 81. In this manner a single logic circuit, the row hammer refresh logic 122, is used for both the normal address and the redundant address calculations (based upon the RHR calculator output and the selection circuit 138 output).

Turning to FIG. 9, a portion of another embodiment of the bank control block 22 of FIG. 7 is illustrated. The bank control block, in addition to the elements illustrated in FIG. 7, includes row factors logic 140 that operates to receive an address signal from the row fuse match and generate therefrom a plurality of row factors that are associated with a specified one of the plurality of memory cell rows. As presently illustrated, the row factors logic operates to generate the redundant row addresses that are transmitted to the row hammer refresh logic 122 as well as row factors that are transmitted to the decoder logic 90.

Utilizing the present techniques, and circuitry, by grouping redundant word lines (RWLs) into a single section of a predetermined memory bank (instead of distributing the RWLs in every section of a predetermined bank of memory or in a particular plurality of predetermined sections in a particular memory bank), redundancy evaluation operations may be performed in parallel with memory access operations. Thus, for example, when applying Vt compensation, a normal address, e.g., in section 0 of group 0 of memory array 82 of FIG. 6 may have Vt compensation calculated in parallel with Vt compensation for a redundancy address section, e.g., section 118 of group 15 of the memory array 82 of FIG. 6. Once it is determined that a hit was a redundant hit, the sense amplifiers in section 118 of group 15 of the memory array 82 of FIG. 6 can be activated and the Vt compensation value can be applied. Likewise, once it is determined that a hit was a normal address hit, the sense amplifiers in section 0 of group 0 of the memory array 82 of FIG. 6 can be activated and the Vt compensation value can be applied. In this manner, the tRCD impact of threshold voltage (Vt) compensation associated with the memory access is reduced and/or eliminated. Moreover, to accelerate this process, the row hammer refresh logic 122 may use multiple input signals that are selectively provided to the RHR calculator 81.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device comprising:
at least one memory bank comprising a set of redundant word lines and a set of normal word lines, wherein a redundant word line of the set of redundant word lines when in operation receives relocated data from a normal word line of the set of normal word lines; and
row hammer refresh logic comprising:
a first input that when in operation receives a first signal indicative of whether a match was generated at a fuse of the memory device;
a second input that when in operation receives a redundant row address corresponding to a first location of a memory array of the memory device;
a third input that when in operation receives a word line address corresponding to a second location of the memory array of the memory device; and
an output that when in operation transmits at least one first memory address adjacent to the first location in conjunction with a refresh of the at least one first memory address or at least one second memory address adjacent to the second location in conjunction with a refresh of the at least second first memory address based on a value of the first signal.

2. The memory device of claim 1, wherein the row hammer refresh logic comprises a storage device coupled to the first input, the second input, and the third input, wherein the storage device when in operation receives the first signal, the redundant row address, and the word line address.

3. The memory device of claim 2, wherein the storage device comprises a second output that when in operation transmits an output signal as the redundant row address when the value of the first signal comprises a first binary value.

4. The memory device of claim 3, wherein the second output when in operation transmits the output signal as the word line address when the value of the first signal comprises a second binary value.

5. The memory device of claim 4, wherein the row hammer refresh logic comprises a row hammer refresh calculator coupled to the storage device to receive the output signal.

6. The memory device of claim 5, wherein the row hammer refresh logic comprises a selection circuit that receives the first signal.

7. The memory device of claim 6, wherein the selection circuit generates a redundant pre tab signal based upon the first signal.

8. The memory device of claim 7, wherein the row hammer refresh calculator when in operation calculates the at least one first memory address as being adjacent to the first location when the redundant pre tab signal has a first value.

9. The memory device of claim 8, wherein the row hammer refresh calculator when in operation calculates the at least one second memory address adjacent to the second location when the redundant pre tab signal has a second value.

10. The memory device of claim 1, comprising row fuse logic that when in operation generates the first signal.

11. The memory device of claim 10, comprising row factors logic coupled to the row fuse logic, wherein the row factors logic when in operation generates the redundant row address.

12. A memory device, comprising:
a flip-flop, wherein the flip-flop comprises:
- a first input that when in operation receives a first address corresponding to a first location in a first memory section of the memory device;
- a second input that when in operation receives a second address corresponding to a second location in a redundant portion of a second memory section of the memory device; and
- a third input that when in operation receives an indication of whether the first address has been mapped to the redundant portion of the second memory section of the memory device as a match generated at a fuse of the memory device, wherein the flip-flop when in operation selectively transmits either the first address or the second address based upon a value of the third input; and a row hammer refresh calculator coupled to the flip-flop, wherein the row hammer refresh calculator when in operation generates a third memory address adjacent to the first location in the first memory section for a refresh operation of the third memory address when the row hammer refresh calculator receives the first address from the flip-flop.

13. The memory device of claim 12, wherein the row hammer refresh calculator when in operation generates a fourth memory address adjacent to the second location in the redundant portion of the second memory section of the memory device when the row hammer refresh calculator receives the second address from the flip-flop.

14. The memory device of claim 13, wherein the row hammer refresh calculator when in operation determines which of the first address and the second address has been received from the flip-flop.

15. The memory device of claim 14, wherein the row hammer refresh calculator when in operation generates a fifth memory address adjacent to the first location in the first memory section for the refresh operation of the fifth memory address when the row hammer refresh calculator receives the first address from the flip-flop, wherein the row hammer refresh calculator when in operation generates a sixth memory address adjacent to the second location in the redundant portion of the second memory section of the memory device when the row hammer refresh calculator receives the second address from the flip-flop.

16. The memory device of claim 12, wherein the memory device when in operation concurrently calculates a first threshold voltage compensation value for application to a first sense amplifier when it is determined that the first address has not been mapped to the redundant portion of the second memory section of the memory device and a second voltage compensation value for application to a second sense amplifier when it is determined that the first address has been mapped to the redundant portion of the second memory section of the memory device.

17. The memory device of claim 12, comprising a selection circuit that when in operation transmits an indication of whether the first address has been mapped to the redundant portion of the second memory section of the memory device.

18. A method comprising:
- receiving a first signal indicative of whether a match was generated at a fuse of a memory device;
- receiving a redundant row address corresponding to a first location of a memory array of the memory device;
- receiving a word line address corresponding to a second location of the memory array of the memory device;
- generating an output indicative of at least one first memory address adjacent to the first location or at least one second memory address adjacent to the second location based on a value of the first signal; and
- refreshing the at least one first memory address when the output generated is indicative of the at least one first memory address or refreshing the at least one second memory address when the output generated is indicative of the at least one second memory address.

* * * * *